United States Patent
Howder et al.

(10) Patent No.: US 11,737,275 B2
(45) Date of Patent: Aug. 22, 2023

(54) MICROELECTRONIC DEVICES INCLUDING FILLED SLITS AND MEMORY CELL PILLARS, AND RELATED MEMORY DEVICES AND ELECTRONIC SYSTEMS

(71) Applicant: Micron Technology, Inc., Boise, ID (US)

(72) Inventors: Collin Howder, Boise, ID (US); Justin D. Shepherdson, Meridian, ID (US); Chet E. Carter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/233,158

(22) Filed: Apr. 16, 2021

(65) Prior Publication Data
US 2022/0336485 A1    Oct. 20, 2022

(51) Int. Cl.
*H10B 43/27*  (2023.01)
*H10B 43/50*  (2023.01)

(52) U.S. Cl.
CPC ............. *H10B 43/27* (2023.02); *H10B 43/50* (2023.02)

(58) Field of Classification Search
CPC .......................... H01L 27/11582; H10B 43/27
See application file for complete search history.

(56) References Cited

U.S. PATENT DOCUMENTS

| | | | |
|---|---|---|---|
| 2017/0077131 A1 | 3/2017 | Konagai et al. | |
| 2018/0006052 A1 | 1/2018 | Hwang | |
| 2018/0130814 A1* | 5/2018 | Lee | H01L 27/11568 |
| 2020/0266204 A1 | 8/2020 | Howder et al. | |
| 2020/0350168 A1 | 11/2020 | Kim et al. | |
| 2021/0066460 A1* | 3/2021 | Haller | H01L 29/40114 |
| 2021/0082933 A1* | 3/2021 | Ito | G11C 5/025 |

OTHER PUBLICATIONS

International Search Report for International Application No. PCT/US2022/022039, dated Jul. 11, 2022, 3 pages.
International Written Opinion for International Application No. PCT/US2022/022039, dated Jul. 11, 2022, 4 pages.
Taiwanese Search Report and Office Action from Taiwanese Application No. 111110996, dated Jan. 17, 2023, 16 pages with English translation.

* cited by examiner

*Primary Examiner* — Robert G Bachner
*Assistant Examiner* — Molly K Reida
(74) *Attorney, Agent, or Firm* — TraskBritt

(57) ABSTRACT

A microelectronic device may include a source structure and a stack structure. The stack structure may include a vertically alternating sequence of insulative structures and conductive structures. Filled slits may extend through the stack structure and into the source structure, the slits dividing the stack structure into multiple blocks. Memory cell pillars may extend through the stack structure and into the source structure, the memory cell pillars and the filled slits terminated at substantially the same depth within the source structure as one another.

21 Claims, 17 Drawing Sheets

US 11,737,275 B2

MICROELECTRONIC DEVICES INCLUDING FILLED SLITS AND MEMORY CELL PILLARS, AND RELATED MEMORY DEVICES AND ELECTRONIC SYSTEMS

TECHNICAL FIELD

Embodiments of the disclosure relate to the field of microelectronic device design and fabrication. More particularly, the disclosure relates to methods for forming microelectronic devices (e.g., memory devices, such as 3D NAND memory devices) wherein slit plugs and pillar plugs are formed simultaneously, and to related devices, systems, and methods.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line).

In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically alternate conductive materials with insulating (e.g., dielectric) materials. The conductive materials function as control gates for, e.g., access lines (e.g., word lines) of the memory cells. Vertical structures (e.g., pillars comprising channel structures and tunneling structures) extend along the vertical string of memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source line. A 3D NAND memory device also includes electrical connections between, e.g., access lines (e.g., word lines) and other conductive structures of the device so that the memory cells of the vertical strings can be selected for writing, reading, and erasing operations.

Due to the complexity of such devices, manufacturing can involve the duplication of many processes to achieve the desired end structures and functionality of the device. However, repeating processing steps in manufacturing devices such as 3D NAND memory devices may increase the cost of manufacturing. For example, multiple patterning sequences, each involving a separate mask step, lithography step, and etch step may significantly increase the cost of manufacturing.

DETAILED DESCRIPTION

Figure 1:
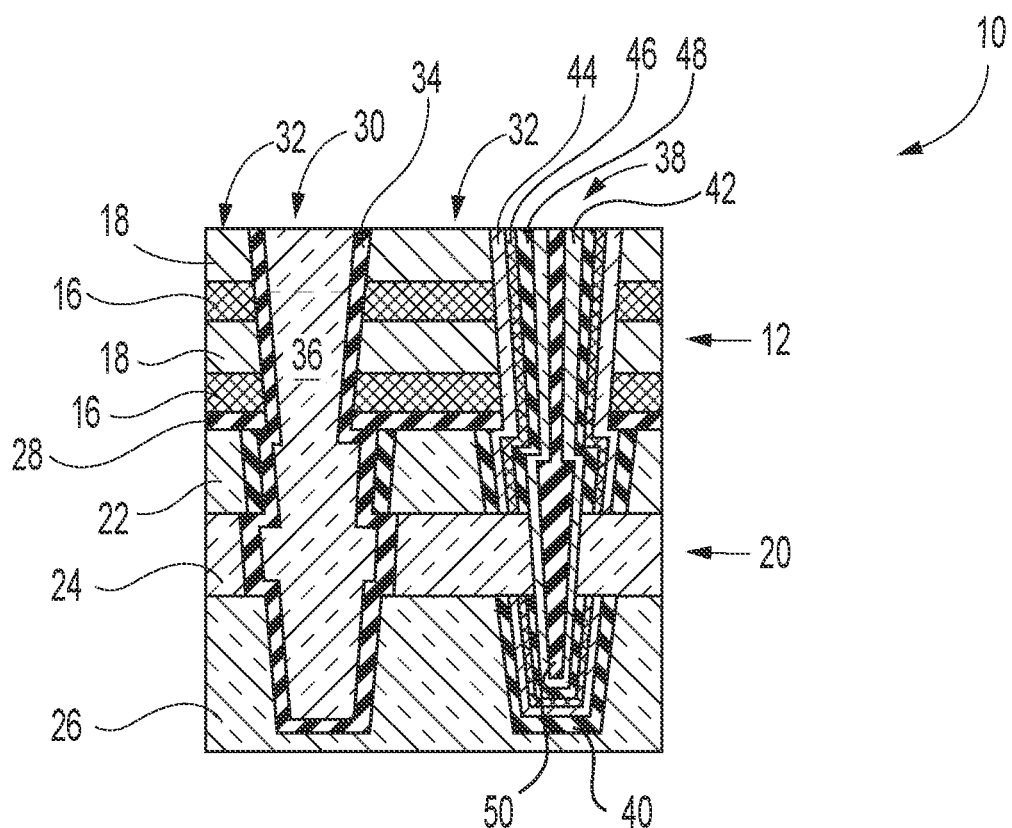
FIG. 1 is a cross-sectional, elevational, schematic illustration of a microelectronic device structure, according to embodiments of the disclosure, with slits and pillar structures extending to substantially the same depth.

Structures (e.g., microelectronic device structures), apparatus (e.g., microelectronic devices), and systems (e.g., electronic systems), according to embodiments of the disclosure, include a source structure with a conductive region formed in a process wherein a sacrificial material is removed from the source structure and then replaced with a conductive material to form the conductive region. To facilitate this process, pillar structures are formed through the sacrificial material and extend into an underlying source region of the source structure. By extending the pillar structures into the underlying source region of the source structure, the pillar structures may provide support when the sacrificial material is removed from the source structure. Slits may be utilized to access the sacrificial material in the source structure to facilitate the removal of the sacrificial material and the replacement with the conductive material to form the conductive region of the source structure. This may be accomplished by utilizing pillar plugs for the pillar structures that extend into the source region underlying the sacrificial region, and slit plugs that extend into the sacrificial region. Due to conventionally different depths of the pillar plugs and slit plugs, conventional processes have generally required two patterning sequences involving a mask step, a lithography step, and an etch step, which can be costly. Embodiments of the disclosure eliminate the second patterning sequence. Both the pillar plugs and the slit plugs may be formed simultaneously during the same patterning sequence. In addition, the pillar plugs and the slit plugs may be formed to extend to substantially the same depth within the source structure. Both the pillar plugs and the slit plugs may extend into the source region underlying the sacrificial region of the source structure. Controlled recessing of the slit plugs may provide access to the sacrificial region, for the removal of the sacrificial material, without opening up the underlying source region, and thus preventing the undesirable removal of the material of the underlying source region.

As used herein, the term "opening" means a volume extending through at least one structure or at least one material, leaving a gap in that at least one structure or at least one material, or a volume extending between structures or materials, leaving a gap between the structures or materials. Unless otherwise described, an "opening" is not necessarily empty of material. That is, an "opening" is not necessarily void space. An "opening" formed in or between structures or materials may comprise structure(s) or material(s) other than that in or between which the opening is formed. Structure(s) or material(s) "exposed" within an opening is (are) not necessarily in contact with an atmosphere or non-solid environment. Structure(s) or material(s) "exposed" within an opening may be adjacent or in contact with other structure(s) or material(s) that is (are) disposed within the opening.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, structures, or junctions in the base semiconductor structure or foundation.

As used herein, the term "insulative material" means and includes electrically insulative material. An insulative material may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric carboxynitride material (e.g., a silicon carboxynitride ($SiO_xC_zN_y$)), and/or air. Formulae including one or more of "x," "y," and/or "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and/or "z" atoms of an additional element (if any), respectively, for every one atom of another element (e.g., Si, Al, Hf, Nb, Ti). As the formulae are representative of relative atomic ratios and not strict chemical structure, an insulative material or insulative structure may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, the term "sacrificial," when used in reference to a material or structure, means and includes a material or structure that is formed during a fabrication process but which is removed (e.g., substantially removed) prior to completion of the fabrication process.

As used herein, the terms "horizontal" or "lateral" mean and include a direction that is parallel to a primary surface of the substrate on which the referenced material or structure is located. The width and length of a respective material or structure may be defined as dimensions in a horizontal plane. With reference to the figures, the "horizontal" direction may be perpendicular to an indicated "Z" axis and may be parallel to an indicated "X" axis.

As used herein, the terms "vertical" or "longitudinal" mean and include a direction that is perpendicular to a primary surface of the substrate on which a referenced material or structure is located. The height of a respective material or structure may be defined as a dimension in a vertical plane. With reference to the figures, the "vertical" direction may be parallel to an indicated "Z" axis and may be perpendicular to an indicated "X" axis.

As used herein, the term "width" means and includes a dimension, along a horizontal plane (e.g., at a certain elevation, if identified), defining a maximum distance, along such plane, of the material or structure in question. For example, a "width" of a structure, that is at least partially hollow, is the horizontal dimension between outermost edges or sidewalls of the structure, such as an outer diameter for a hollow, cylindrical structure.

As used herein, the terms "thickness" or "thinness" mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0/6 met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the primary surface of the substrate on which the reference material or structure is located. As used herein, a "level" and an "elevation" are each defined by a horizontal plane parallel to the primary surface. "Lower levels" and "lower elevations" are nearer to the primary surface of the substrate, while "higher levels" and "higher elevations" are further from the primary surface. Unless otherwise specified, these spatially relative terms are intended to encompass different orientations of the materials in addition to the orientation as depicted in the figures. For example, the materials in the figures may be inverted, rotated, etc., with the spatially relative "elevation" descriptors remaining constant because the referenced primary surface would likewise be respectively reoriented as well.

As used herein, the terms "comprising," "including," "having," and grammatical equivalents thereof are inclusive or open-ended terms that do not exclude additional, unrecited elements or method steps, but these terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a composition (e.g., gas) described as "comprising," "including," and/or "having" a species may be a composition that, in some embodiments, includes additional species as well and/or a composition that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, sub-structure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods.

However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

FIG. 1 illustrates a microelectronic device structure 10 (e.g., a memory device structure, such as a 3D NAND memory device structure) according to embodiments of the disclosure, for an apparatus (e.g., a memory device, such as a 3D NAND memory device), which may be included in a system. The microelectronic device structure 10 may include a stack structure 12 including a vertically alternating sequence of insulative structures 16 and conductive structures 18. For example, the stack structure 12 may comprise alternating insulative structures 16 comprising dielectric oxide, such as silicon oxide, and conductive structures 18 comprising conductive material (e.g., metal, such as tungsten (W); conductively doped semiconductive material, such as conductively doped polysilicon).

Below the stack structure 12, one or more substrate or other base materials, support the stack structure 12. For example, the stack structure 12 may be above a source structure 20, which may comprise a cap region 22, a conductive contact region 24 (e.g., a lateral contact region), and a source region 26. Each of the conductive contact region 24 and the source region 26 may be formed of conductive material, such as polysilicon doped within one or more N-type dopants (e.g., one or more of phosphorus (P), arsenic (Ar), antimony (Sb), and bismuth (Bi)). The cap region 22 may be formed of polysilicon. A barrier structure 28 may be located between the source structure 20 and the stack structure 12, and may be formed of and include an insulative material, such as a dielectric oxide (e.g., $SiO_x$, such as $SiO_2$).

Filled slits 30 (e.g., filled openings, filled trenches, filled slots) may be filled with at least one dielectric liner 34 (e.g., at least one dielectric oxide liner) and at least one fill material 36 (e.g., dielectric material, semiconductive material, conductive material), and may extend through the stack structure 12 and into the source structure 20. The dielectric liner 34 may electrically isolate the fill material 36 from the materials (e.g., semiconductive materials, conductive materials) of the source structure 20. The filled slits 30 may extend similarly to an elongated trench and divide the stack structure into block portions 32. A portion of the filled slits 30 may also extend laterally (e.g., in the Y-direction) below the stack structure 12, and portions of the dielectric liner 34 may directly underlie the stack structure 12.

Memory cell pillars 38 may also extend through the stack structure 12 and into the source structure. The memory cell pillars 38 may have a generally cylindrical shape. The memory cell pillars 38 may include a dielectric liner 40 (e.g., a dielectric oxide liner) within the source region 26 of the source structure 20. The memory cell pillars 38 may additionally individually include a charge-blocking material 44, such as first dielectric oxide material (e.g., $SiO_x$, such as $SiO_2$; $AlO_x$, such as $Al_2O_3$); a charge-trapping material 46, such as a dielectric nitride material (e.g., $SiN_y$, such as $Si_3N_4$); a tunnel dielectric material 48, such as a second oxide dielectric material (e.g., $SiO_x$, such as $SiO_2$); a channel material 42, such as a semiconductive material (e.g., silicon, such as polycrystalline Si); and a dielectric fill material 50 (e.g., a dielectric oxide, a dielectric nitride, air). The charge-blocking material 44 may be formed on or over surfaces of the conductive structures 18 and the insulative structures 16 of the stack structure 12 at least partially defining horizontal boundaries of the cell pillar structures, as well as on or over surfaces of the dielectric liner 40 within the source structure 20. The charge-trapping material 46 may be horizontally surrounded by the charge-blocking material 44. The tunnel dielectric material 48 may be horizontally surrounded by the charge-trapping material 46. The channel material 42 may be horizontally surrounded by the tunnel dielectric material 48. The dielectric fill material 50 may be horizontally surrounded by the channel material 42. The channel material 42 of each of the memory cell pillars 38 may be in electrical communication with conductive material of the conductive contact region 24 (e.g., lateral contact region) of the source structure 20. For example, conductive polysilicon (e.g., polysilicon doped with one or more N-type dopants) of the conductive contact region 24 may be in direct physical contact with the channel material 42. A portion of the memory cell pillars 38 may also extend laterally (e.g., in the X-direction and the Y-direction) below the stack structure 12, and portions of the dielectric liner 40 may directly underlie the stack structure 12.

The filled slits 30 and the memory cell pillars 38 may extend to substantially the same depth (e.g., vertical position, elevation) within the source structure 20, and may extend through the cap region 22 and the conductive contact region 24, and into the source region 26. Accordingly, bottoms (e.g., lower vertical boundaries) of the dielectric liners 34 of the filled slits 30 may be substantially coplanar with bottoms (e.g., lower vertical boundaries) of the dielectric liners 40 of the memory cell pillars 38 within the source region 26 of the source structure 20.

Accordingly, a microelectronic device is disclosed that may include a source structure and a stack structure. The stack structure may include a vertically alternating sequence of insulative structures and conductive structures. Filled slits may extend through the stack structure and into the source structure, the slits dividing the stack structure into multiple blocks. Memory cell pillars may extend through the stack structure and into the source structure, the memory cell pillars and the filled slits terminated at substantially the same depth within the source structure as one another.

Additionally, a memory device is disclosed that may include a source structure, a stack structure, filled slits, and memory cell pillars. The source structure may include a source region, a lateral contact region, and a cap region. The stack structure may include an alternating sequence of insulative structures and conductive structures. The filled slits may each include a dielectric liner filled with a fill material extending through the stack structure and into the source structure. The memory cell pillars may each include a channel material, a tunnel dielectric material, a charge blocking material, and a dielectric liner extending into the source structure, bottoms of the dielectric liners of the memory cell pillars may be substantially coplanar with bottoms of the dielectric liners of the filled slits.

Figure 2:
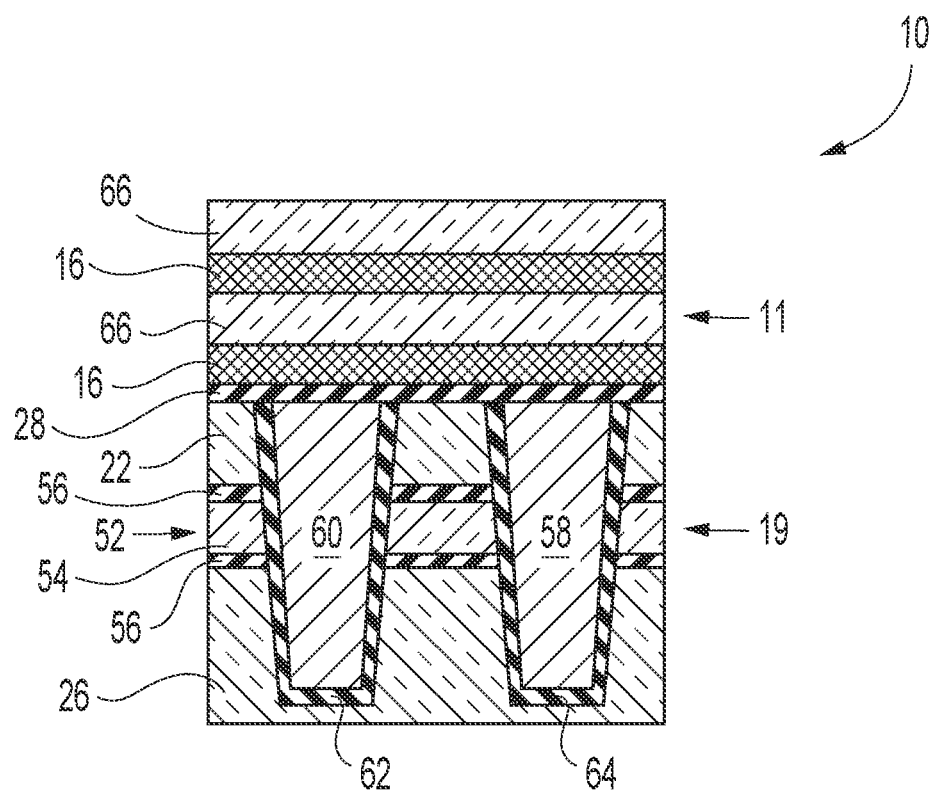
FIG. 2 through FIG. 14, in conjunction with FIG. 1, are cross-sectional, elevational, schematic illustrations during various stages of processing to fabricate the microelectronic device structure illustrated in FIG. 1, according to embodiments of the disclosure.

FIG. 2 illustrates the microelectronic device structure 10 (e.g., a memory device structure, such as a 3D NAND memory device structure) in an intermediate stage of manufacturing. A preliminary source structure 19 may be formed, and may include a sacrificial region 52 positioned between the cap region 22 and the source region 26. The sacrificial region 52 may comprise sacrificial material 54, such as polysilicon, positioned between at least two dielectric structures 56, such as at least two dielectric oxide structures.

Pillar plugs 58 and slit plugs 60 may be formed within the preliminary source structure 19. The pillar plugs 58 and the slit plugs 60 may be formed within the preliminary source structure 19 substantially simultaneously. The pillar plugs 58 and the slit plugs 60 may be formed to extend through the cap region 22 and the sacrificial region 52, and into the source region 26 of the preliminary source structure 19. The pillar plugs 58 and slit plugs 60 may have substantially the same height (e.g., vertical dimension in the Z-direction), and may be formed utilizing a single patterning sequence of at least one masking step, at least one lithography step, and at least one etching step. The pillar plugs 58 may fill individual holes that may be generally cylindrical and the slit plugs 60 may be configured as strips that fill elongated trenches. The slit plugs 60 may be wider than the pillar plugs 58, and the slit plugs 60 and pillar plugs 58, while formed simultaneously, may or may not extend to the exact same depth, but may extend to substantially the same depth within the source structure 20. The bottom of the pillar plugs 58 may be positioned several hundred angstroms into the source region 26 to provide structural support during later processing steps, as will be described in more detail below. The precise position of the bottom of the slit plugs 60 may be slightly deeper or shallower than the pillar plugs 58, but may be at substantially the same depth, due to being formed during the same patterning sequence.

The pillar plugs 58 and slit plugs 60 may comprise a hard etch stop material (e.g., a metal, such as tungsten) lined with dielectric liners 62, 64 (e.g., dielectric oxide liners). In some embodiments the dielectric liners 62, 64 individually have a thickness between about 60 and about 80 angstroms. Optionally, seed material, such as titanium nitride, may be formed on the dielectric liners 62, 64 to promote the formation of the hard etch stop material and the adhesion of the hard etch stop material to the dielectric liners 62, 64.

A preliminary stack structure 11 with vertically alternating insulative structures 16 (e.g., dielectric oxide structures) and sacrificial structures 66 (e.g., dielectric nitride structures, polysilicon structures) may be formed over the preliminary source structure 19, the pillar plugs 58, and the slit plugs 60.

Figure 3:
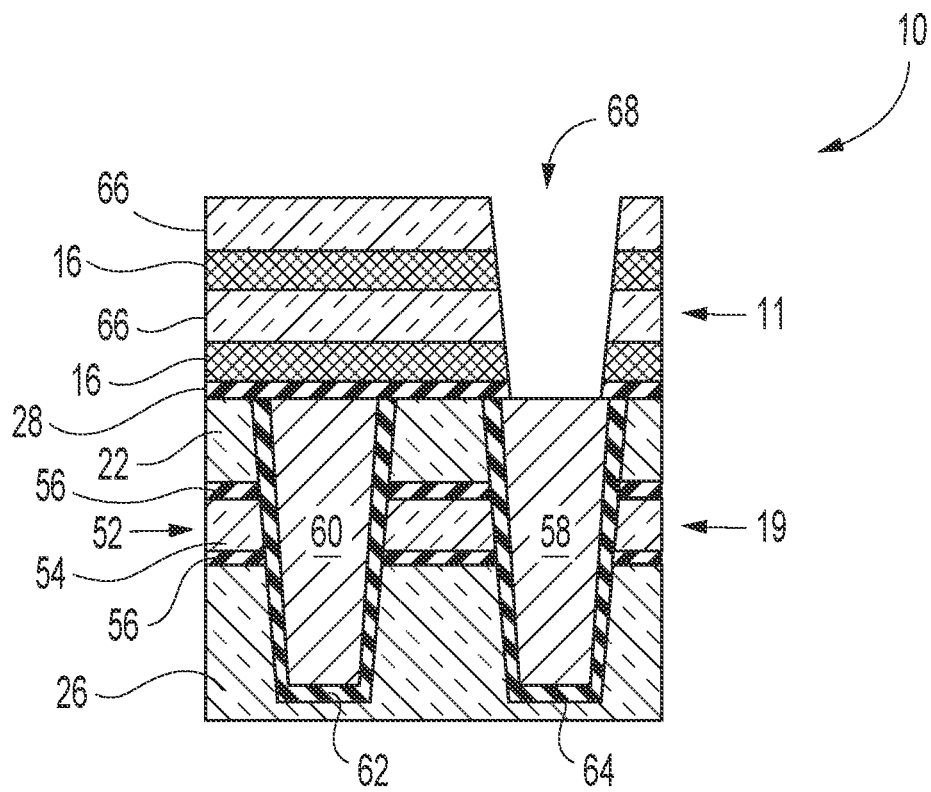
Figure 3:
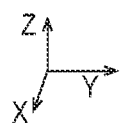

Referring next to FIG. 3, pillar openings 68 (e.g., apertures) may be formed to extend through the preliminary stack structure 11 and to the pillar plugs 58. The pillar plugs 58 may then be removed through an exhumation process selective to the material of the pillar plugs 58.

Figure 4:
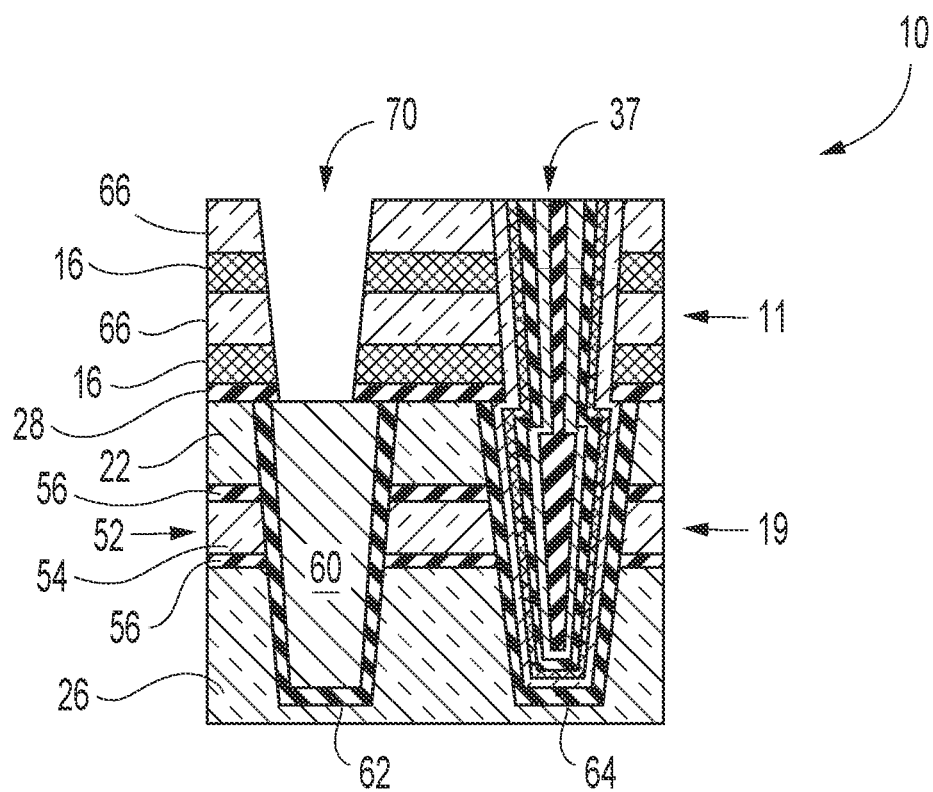

Referring next to FIG. 4, preliminary memory cell pillars 37 to become portions of the memory cell pillars 38 (FIG. 1) may be formed within the pillar openings 68 after the removal of the pillar plugs 58. The preliminary memory cell pillars 37 may be formed to include the charge-blocking material 44, the charge-trapping material 46, the tunnel dielectric material 48, the channel material 42, and the dielectric fill material 50 previously described with reference to FIG. 1. Additionally, slit openings 70 may be formed to extend through the preliminary stack structure 11 and to the slit plugs 60. The slit openings 70 may extend along a length (e.g., in the X-direction) of the preliminary stack structure 11 (e.g., in the form of a trench), such as by etching through the preliminary stack structure 11, to divide the preliminary stack structure 11 into multiple blocks separated from one another by the slit openings 70.

Figure 5:
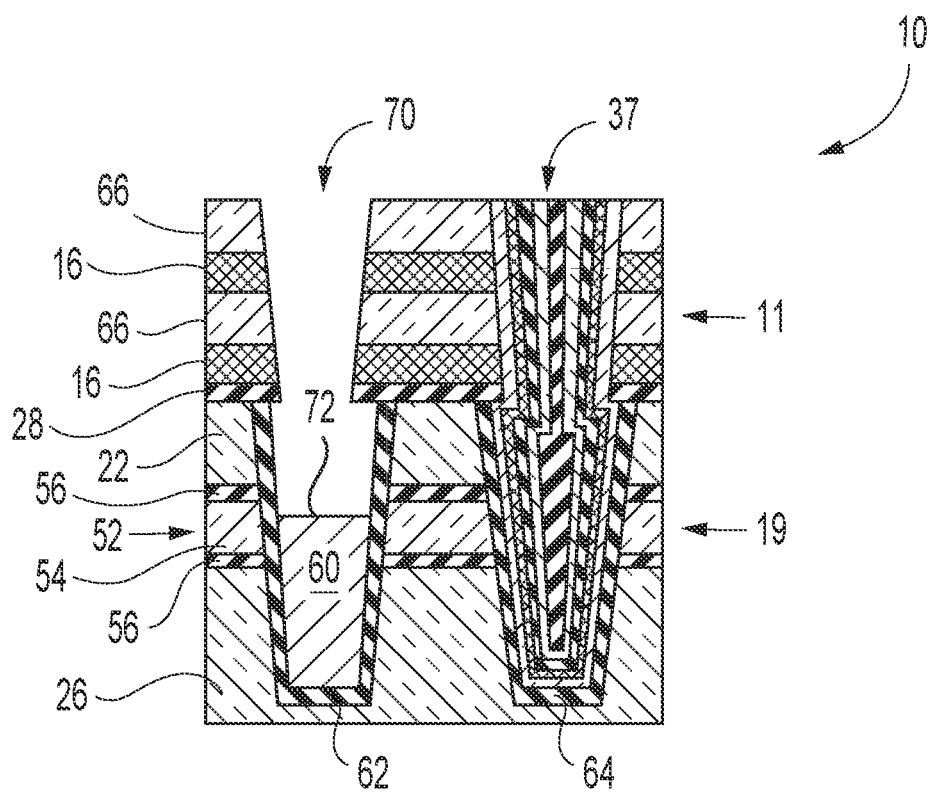

Referring next to FIG. 5, portions (e.g., upper portions) of the slit plugs 60 may be removed to position end surfaces 72 (e.g., upper surfaces, upper vertical boundaries) of the slit plugs 60 within the sacrificial region 52 of the preliminary source structure 19. The portions of the slit plugs 60 may be, for example, removed using a wet etching process, such as a phosphoric-acetic-nitric acid (PAN) wet etching process. Following the material removal process, the end surface 72 of the slit plugs 60 may be positioned within vertical boundaries of the sacrificial region 52 of the preliminary source structure 19.

Figure 6:
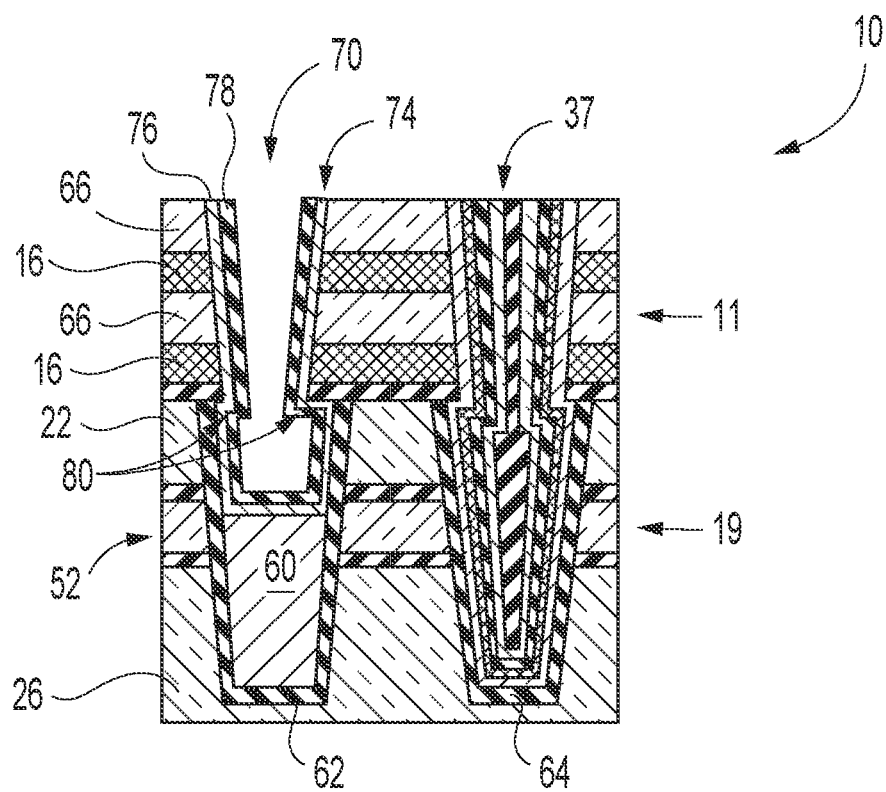

Referring next to FIG. 6, a protective liner 74 may be formed within the slit openings 70. The protective liner 74 may, for example, comprise a doped semiconductive material 76 (e.g., polysilicon doped with at least one P-type dopant, such as one or more of boron, aluminum, and gallium), and a dielectric material 78 (e.g., a dielectric oxide material, such as $SiO_x$) on or over the doped semiconductive material 76. In some embodiments, the doped semiconductive material 76 has a thickness between about 100 and about 200 angstroms, and the dielectric material 78 has a thickness between about 150 and 250 angstroms. As shown in FIG. 6, the protective liner 74 may include a portion 80 of an underside of the preliminary stack structure 11 exposed through the removal of the portions of the slit plugs 60. Additionally, the protective liner 74 in the slit openings 70 may cover the end surfaces 72 of the slit plugs 60 within the sacrificial region 52 of the preliminary source structure 19.

Figure 7:
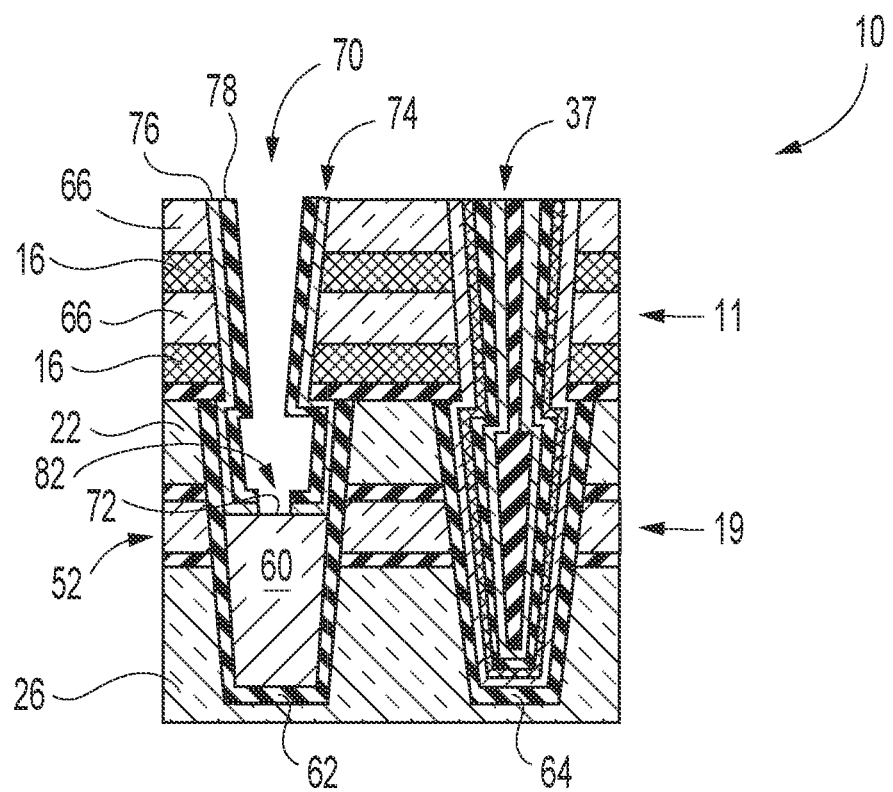

Referring next to FIG. 7, a portion of the protective liner 74 in the slit openings 70 may be removed to expose at least a portion of the end surfaces 72 of the slit plugs 60. For example, an aperture 82 may be formed extending through a bottom portion of the protective liner 74, such as with a reactive ion etched biased "punch through" process, to expose the underlying hard etch stop material of remaining portions of the slit plugs 60.

Figure 8:
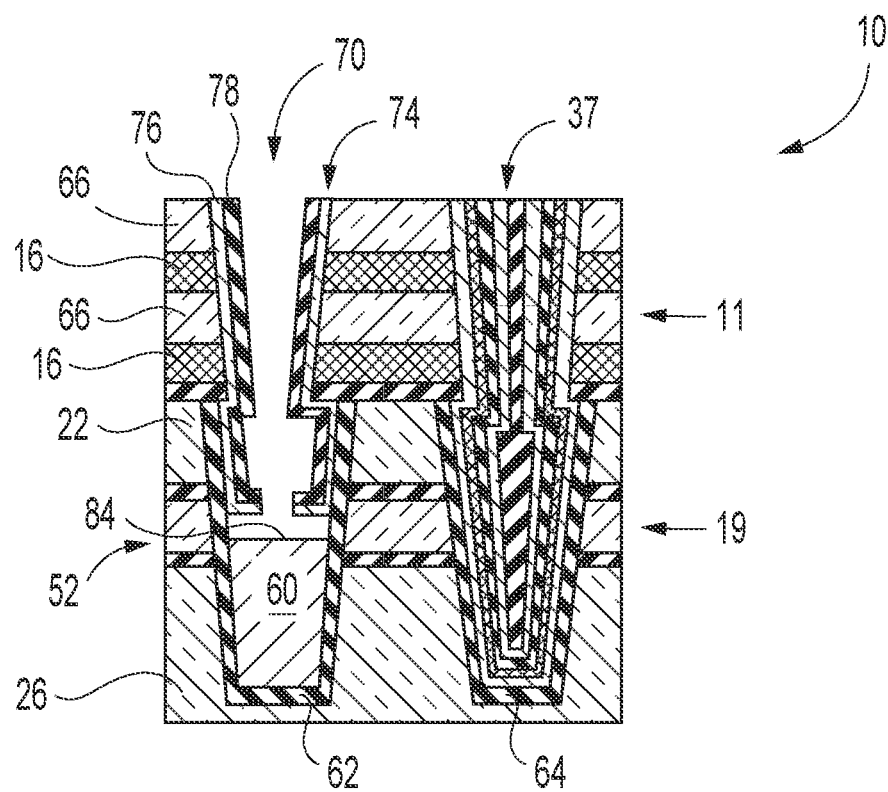
Figure 8:
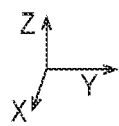

Referring next to FIG. 8, an additional portion of the slit plugs 60 may be removed to form new end surfaces 84 (e.g., new upper surfaces, new upper vertical boundaries) of the slit plugs 60 that are both vertically offset from the protective liner 74 and positioned within the sacrificial region 52 of the preliminary source structure 19. For example, a recess may be formed in the slit plugs 60 with a wet etching process, such as a PAN wet etching process. Following the additional material removal process, the new end surface 84 of the slit plugs 60 may be positioned within the sacrificial region 52 of the preliminary source structure 19. This may expose portions of the dielectric liner 62 within the sacrificial region 52 of the preliminary source structure 19.

Figure 9:
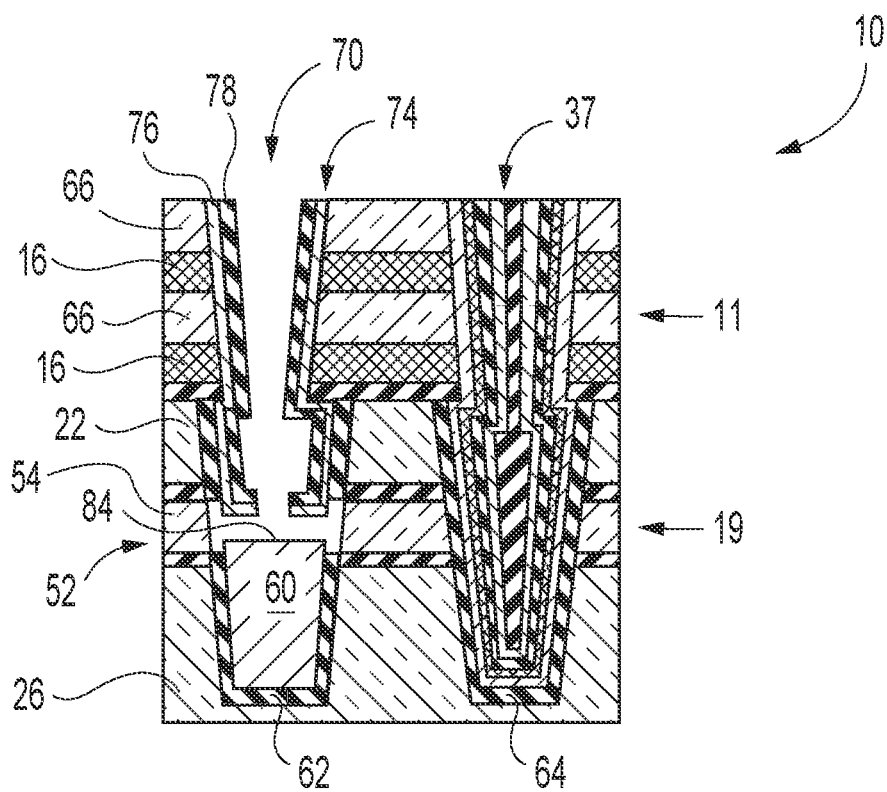

Referring next to FIG. 9, a portion of the dielectric liner 62 of the slit plugs 60 may be removed to expose the sacrificial material 54 of the sacrificial region 52 of the preliminary source structure 19. During material removal process, the dielectric material 78 of the protective liner 74 in the slit openings 70 may be thinned, but not fully removed.

Figure 10:
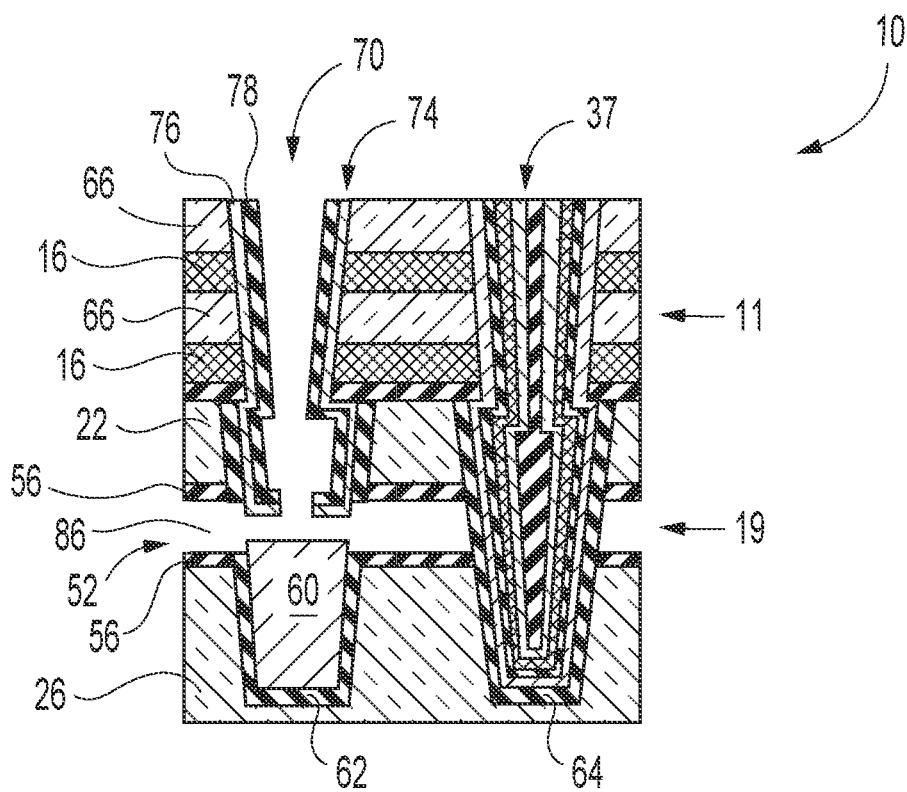

Referring next to FIG. 10, the sacrificial material 54 (FIG. 9) of the sacrificial region 52 of the preliminary source structure 19 may be removed (e.g., exhumed) to form an open region 86. For example, if the sacrificial material 54 comprises polysilicon, the sacrificial material 54 may be removed using an etchant comprising tetramethylammonium hydroxide (TMAH). As another example, if the sacrificial material 54 comprises a dielectric nitride (e.g., $SiN_y$, such as $Si_3N_4$), the sacrificial material 54 may be removed using an etchant comprising hot phosphoric acid.

Figure 11:
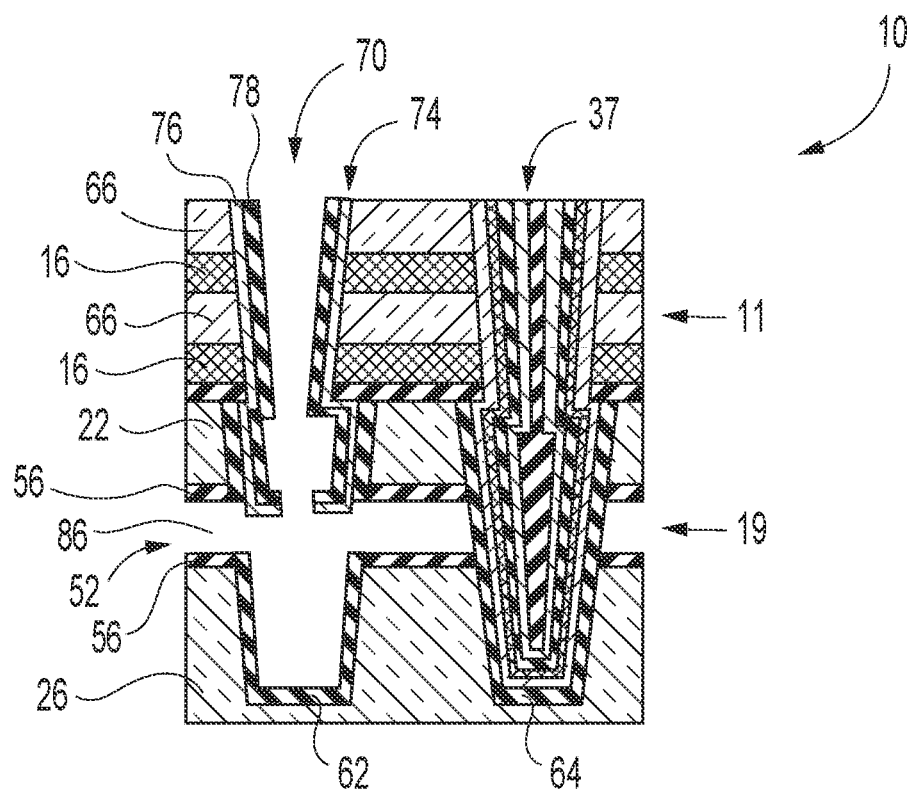

Referring next to FIG. 11, optionally, remaining hard etch stop material of the slit plugs 60 may be removed. As a non-limiting example, if the slit plugs 60 comprise tungsten, an ammonia peroxide mixture (APM) or a sulfuric acid, water and hydrogen peroxide mixture (piranha) may be utilized to exhume the remaining hard etch stop material of the slit plugs 60. In additional embodiments, the remaining hard etch stop material of the slit plugs 60 is not removed (e.g., is maintained).

Figure 12:
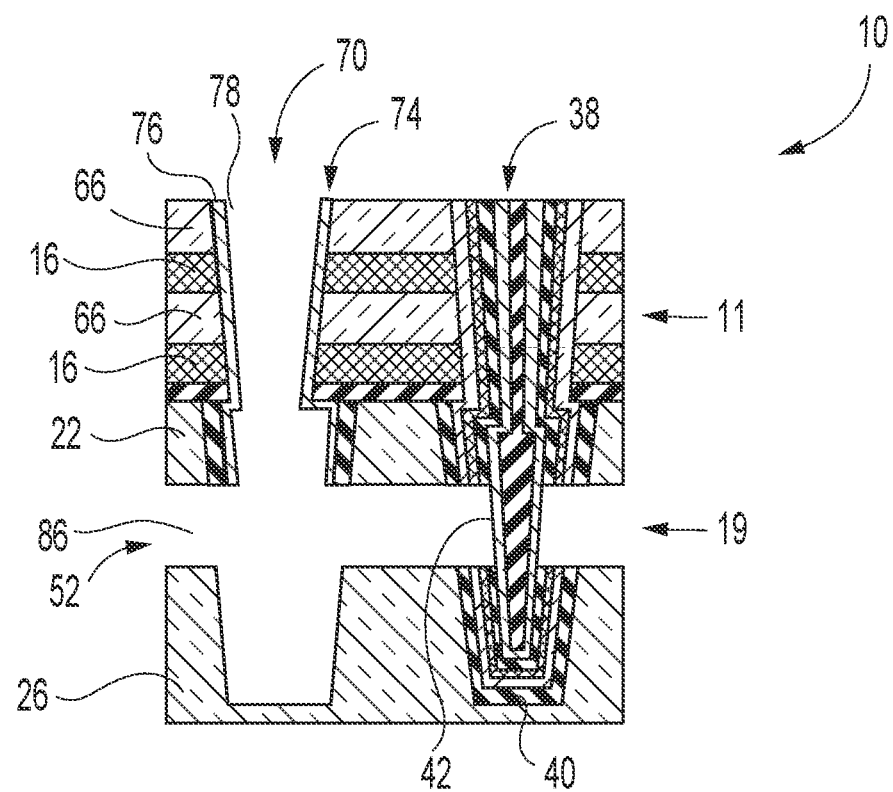

Referring next to FIG. 12, the dielectric structures 56 (FIG. 11) exposed by the removal of the sacrificial material 54 (FIG. 9) may be removed to expose the cap region 22 and of the source region 26 of the preliminary source structure 19, and portions of dielectric liner 64 (FIG. 11), the charge-blocking material 44, the charge-trapping material 46, and the tunnel dielectric material 48 may be removed to expose the channel material 42 and form the memory cell pillars 38.

Figure 13:
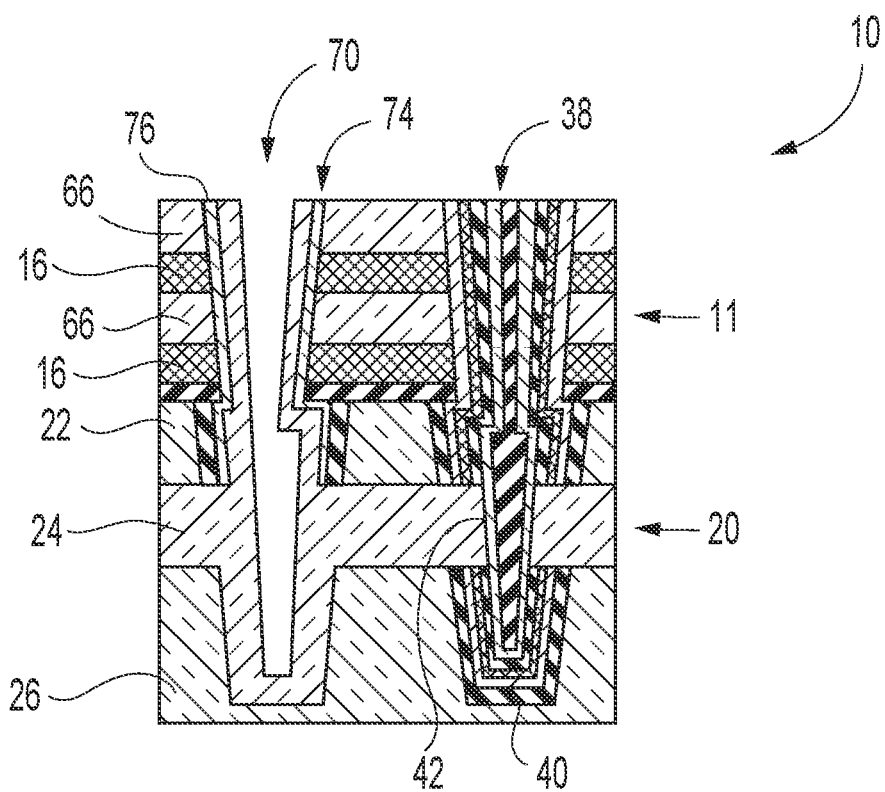
Figure 13:
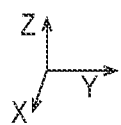

Referring next to FIG. 13, the open region 86 (FIG. 12) may be filled with conductive material (e.g., polysilicon doped with at least one N-type dopant) to form the source structure 20 including the conductive contact region 24 (e.g., lateral contact region). Accordingly, the conductive material of the conductive contact region 24 may electrically connect the conductive material of the source region 26 of the source structure 20 with the channel material 42 of the memory cell pillars 38.

Figure 14:
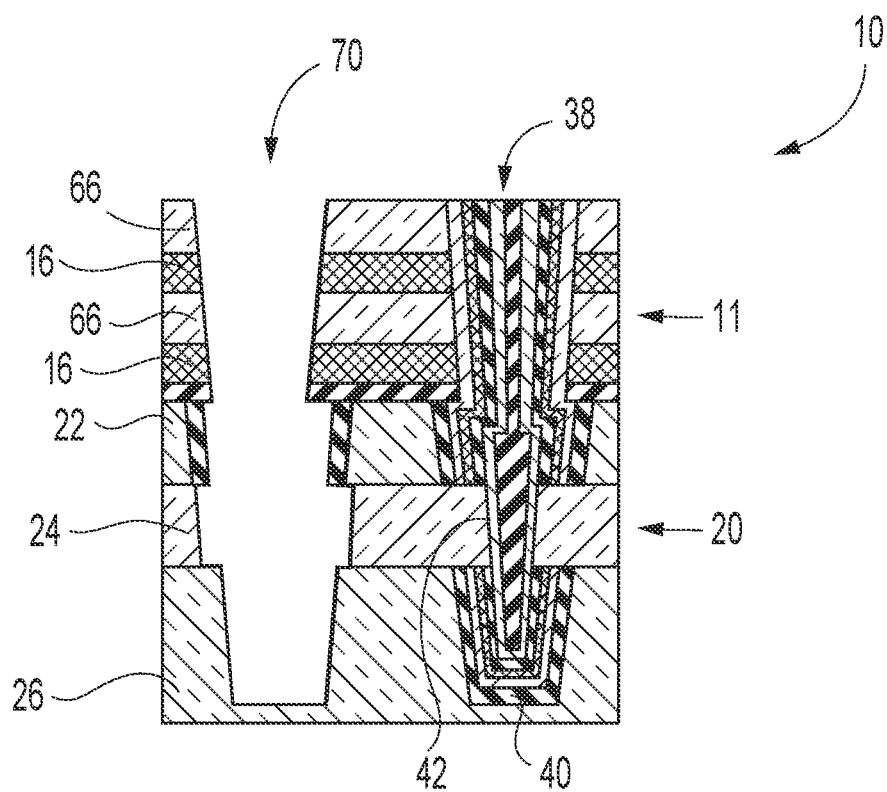

Referring next to FIG. 14, conductive material deposited within the slit openings 70 during the formation of the conductive contact region 24 and remaining material (e.g., polysilicon) from the protective liner 74 (FIG. 13) may be removed from the slit openings 70.

Thereafter, the dielectric liner 34 (FIG. 1) may be formed over portions of the source structure 20 exposed by the slit openings 70, and a so-called "replacement gate" or "gate later" process may be performed to remove the sacrificial structures 66 (FIG. 13) of the preliminary stack structure 11 (FIG. 13) and replace the sacrificial structures 66 with conductive structures 18 to form the stack structure 12 previously described with reference to FIG. 1. Following the replacement gate process, the slit openings 70 may be lined with the dielectric liner 34 (FIG. 1) and may then be at least partially filled with the fill material 36 (e.g., dielectric material, semiconductive material, conductive material) to form the filled slits 30 (FIG. 1).

Accordingly, a method of forming a microelectronic device is disclosed. The method may include forming a source structure comprising a sacrificial region positioned between a cap region and a source region. The method may further include forming pillar plugs in the source structure, and forming slit plugs in the source structure simultaneously with forming the pillar plugs.

Figure 15:
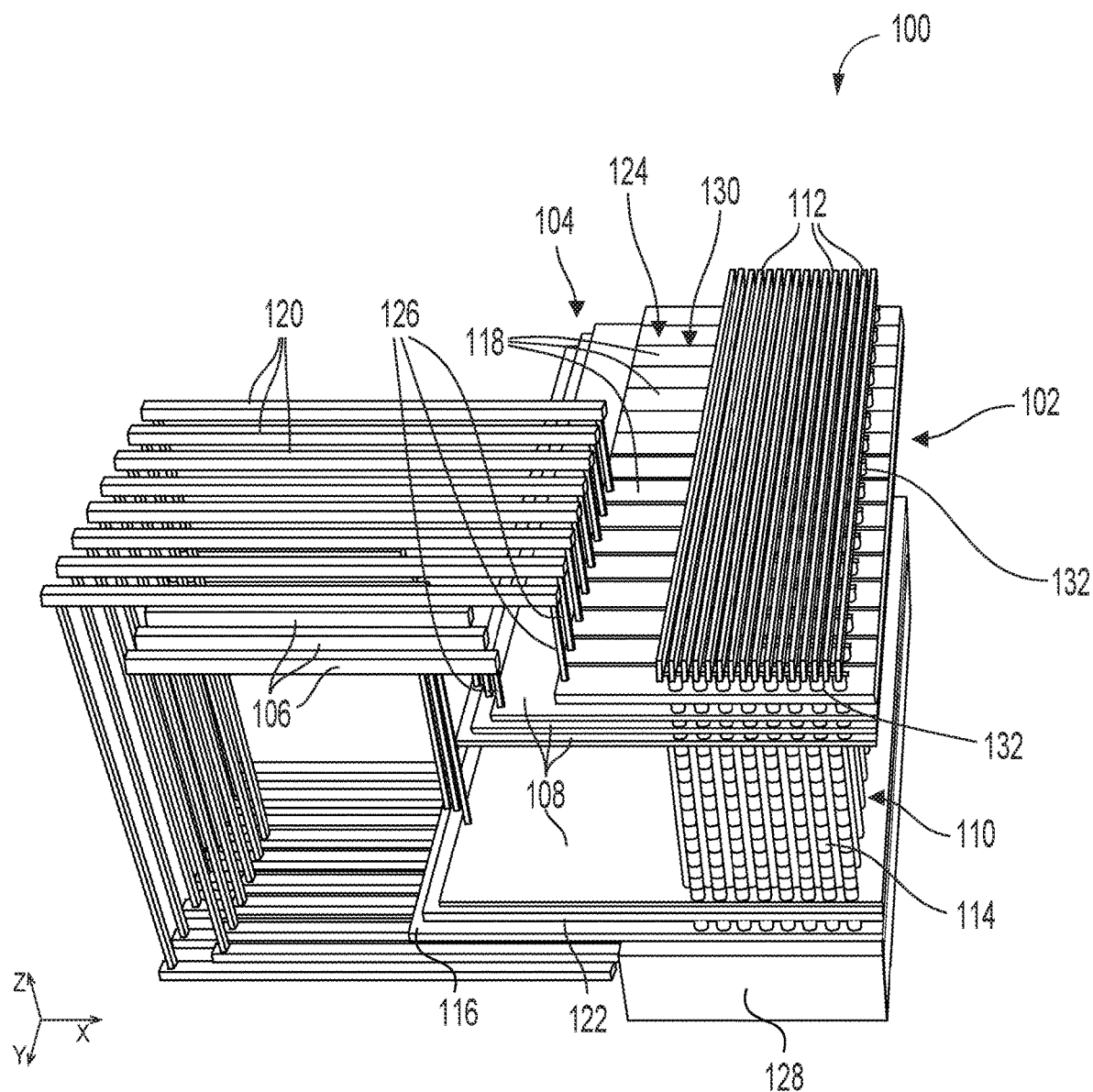
FIG. 15 is a partial, cutaway, perspective, schematic illustration of a microelectronic device, in accordance with embodiments of the disclosure.

FIG. 15 illustrates a partial cutaway, perspective, schematic illustration of a portion of a microelectronic device 100 (e.g., a memory device, such as a 3D NAND Flash memory device) including a microelectronic device structure 102. The microelectronic device structure 102 may be substantially similar to the microelectronic device structure 10 of FIG. 1.

As illustrated in FIG. 15, the microelectronic device structure 102 may further include at least one staircase structure 104 defining contact regions for connecting access lines 106 to conductive structures 108 (e.g., the conductive structures 18 (FIG. 1)).

The microelectronic device structure 102 may also include vertical strings 110 of memory cells 114 coupled to each other in series. The memory cells 114 may be formed at the intersections of the memory cell pillars (the memory cell pillars 38 previously described with reference to FIG. 1) and the conductive structures 108. In some embodiments, the memory cells 114 comprise so-called "MONOS" (metal-oxide-nitride-oxide-semiconductor) memory cells. In additional embodiments, the memory cells 114 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 114 comprise so-called "floating gate" memory cells including floating gates (e.g., metallic floating gates) as charge storage structures. The floating gates may horizontally intervene between central structures of the memory cell pillars and the conductive structures 108. The vertical strings 110 may extend vertically (e.g., in the Z-direction) and orthogonally relative to the conductive structures 108, data lines 112, a source tier 116 (e.g., the source structure 20 below the stack structure 12 (FIG. 1)), the access lines 106, first select gates 118 (e.g., upper select gates, drain select gates (SGDs)), select lines 120, and a second select gate 122 (e.g., a lower select gate, a source select gate (SGS)). The first select gates 118 may be provided within multiple blocks 124 horizontally separated (e.g., in the Y-direction) from one another by slits 130 (e.g., the filled slits 30 (FIG. 1)).

Vertical conductive contacts 126 may electrically couple components to each other, as illustrated. For example, the select lines 120 may be electrically coupled to the first select gates 118 and the access lines 106 may be electrically coupled to the tiers of the conductive structures 108. The microelectronic device 100 may also include a control unit 128 positioned under the memory array, which may include at least one of string driver circuitry, pass gates, circuitry for selecting gates, circuitry for selecting conductive lines (e.g., the data lines 112, the access lines 106), circuitry for amplifying signals, and circuitry for sensing signals. The control unit 128 may be electrically coupled to the data lines 112, the source tier 116, the access lines 106, the first select gates 118, and the second select gates 122, for example. In some embodiments, the control unit 128 includes CMOS (complementary metal-oxide-semiconductor) circuitry. In such embodiments, the control unit 128 may be characterized as having a "CMOS under Array" ("CuA") configuration.

The first select gates 118 may extend horizontally in a first direction (e.g., the X-direction) and may be coupled to respective first groups of vertical strings 110 of memory cells 114 at a first end (e.g., an upper end) of the vertical strings 110. The second select gate 122 may be formed in a substantially planar configuration and may be coupled to the vertical strings 110 at a second, opposite end (e.g., a lower end) of the vertical strings 110 of memory cells 114.

The data lines 112 (e.g., bit lines) may extend horizontally in a second direction (e.g., in the Y-direction) that is at an angle (e.g., perpendicular) to the first direction in which the first select gates 118 extend. The data lines 112 may be coupled to respective second groups of the vertical strings 110 at the first end (e.g., the upper end) of the vertical strings 110. A first group of vertical strings 110 coupled to a respective first select gate 118 may share a particular vertical string 110 with a second group of vertical strings 110 coupled to a respective data line 112. Thus, a particular vertical string 110 may be selected at an intersection of a particular first select gate 118 and a particular data line 112. Accordingly, the first select gates 118 may be used for selecting memory cells 114 of the vertical strings 110 of memory cells 114.

The conductive structures 108 (e.g., local word line plates) may extend in respective horizontal planes. The conductive structures 108 may be stacked vertically, such that each tier of the conductive structures 108 is coupled to all of the vertical strings 110 of memory cells 114, and the vertical strings 110 of the memory cells 114 extend vertically through the conductive structures 108. The conductive structures 108 may be coupled to or may form control gates of the memory cells 114 to which the conductive structures 108 are coupled. Each conductive structure 108 may be coupled to one memory cell 114 of a particular vertical string 110 of memory cells 114.

The first select gates 118 and the second select gates 122 may operate to select a particular vertical string 110 of the memory cells 114 between a particular data line 112 and the source tier 116. Thus, a particular memory cell 114 may be selected and electrically coupled to a data line 112 by operation of (e.g., by selecting) the appropriate first select gate 118, second select gate 122, and tier of the conductive structures 108 that are coupled to the particular memory cell 114.

The staircase structure 104 may be configured to provide electrical connection between the access lines 106 and the tiers of the conductive structures 108 through the vertical conductive contacts 126. In other words, a particular level of the conductive structures 108 may be selected via one of the access lines 106 that is in electrical communication with a respective one of the vertical conductive contacts 126 in electrical communication with the particular conductive structure 108.

The data lines 112 may be electrically coupled to the vertical strings 110 through conductive structures 132.

Figure 16:
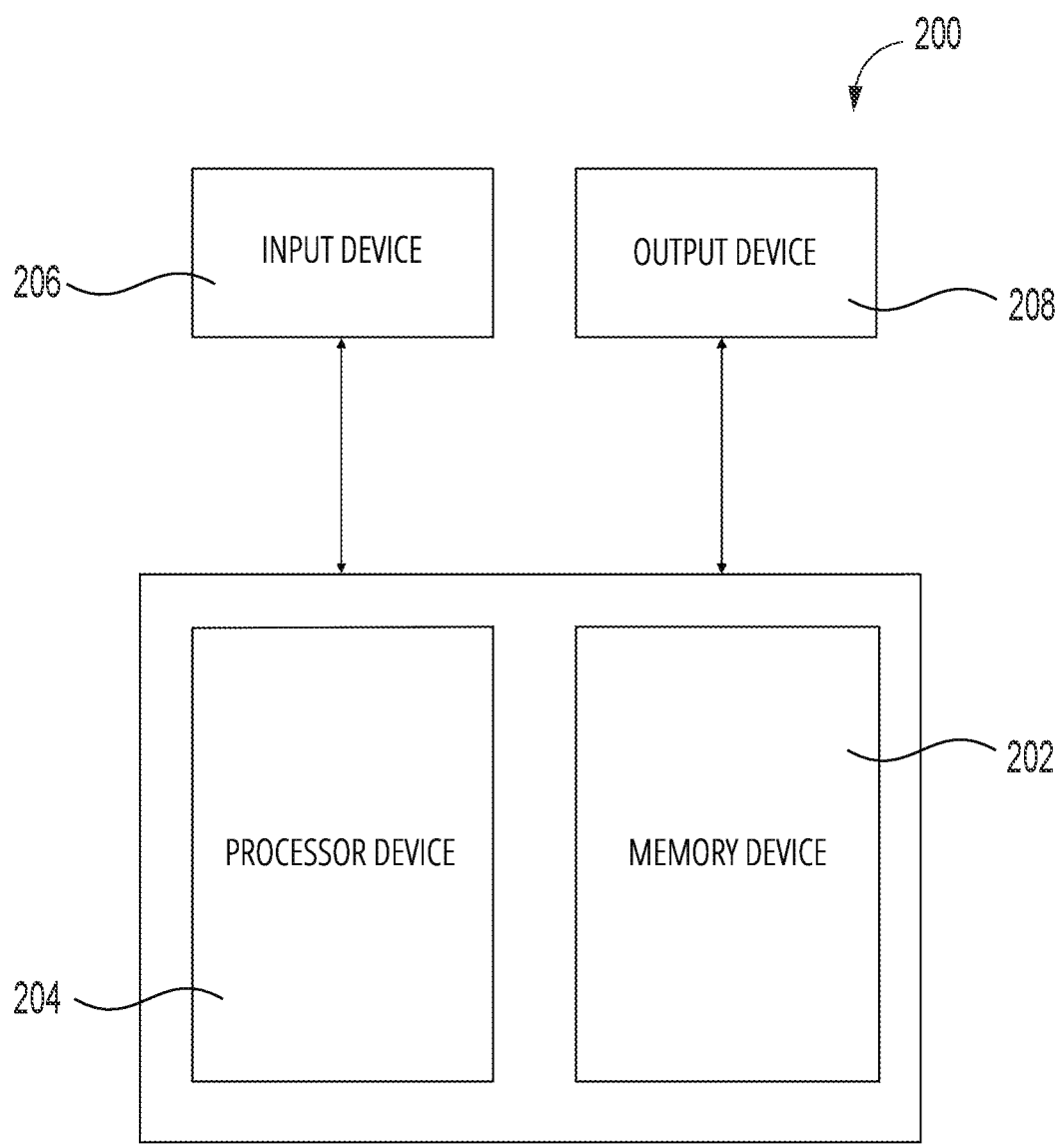
FIG. 16 is a block diagram of an electronic system, in accordance with embodiments of the disclosure.

Microelectronic devices (e.g., the microelectronic device 100) including microelectronic device structures (such as the microelectronic device structure 10 (FIG. 1)) of the disclosure may be used in embodiments of electronic systems of the disclosure. For example, FIG. 16 is a block diagram of an electronic system 200, in accordance with embodiments of the disclosure. The electronic system 200 may comprise, for example, a computer or computer hardware component, a server or other networking hardware component, a cellular telephone, a digital camera, a personal digital assistant (PDA), a portable media (e.g., music) player, a Wi-Fi or cellular-enabled tablet (e.g., an iPAD® or SURFACE® tablet, an electronic book, a navigation device), etc. The electronic system 200 includes at least one memory device 202. The memory device 202 may include, for example, an embodiment of a microelectronic device and/or structure previously described herein (e.g., the microelectronic device structure 10 of FIG. 1), with structures formed according to methods of embodiments previously described herein.

The electronic system 200 may further include at least one electronic signal processor device 204 (often referred to as a "microprocessor"). The electronic signal processor device 204 may, optionally, include an embodiment of a microelectronic device and/or a microelectronic device structure previously described herein (e.g., the microelectronic device structure 10 of FIG. 1). The electronic system 200 may further include one or more input devices 206 for inputting information into the electronic system 200 by a user, such as, for example, a mouse or other pointing device, a keyboard, a touchpad, a button, or a control panel. The electronic system 200 may further include one or more output devices 208 for outputting information (e.g., visual or audio output) to a user such as, for example, a monitor, a display, a printer, an audio output jack, a speaker, etc. In some embodiments, the input device 206 and the output device 208 may comprise a single touchscreen device that can be used both to input information into the electronic system 200 and to output visual information to a user. The input device 206 and the output device 208 may communicate electrically with one or more of the memory device 202 and the electronic signal processor device 204.

Figure 17:
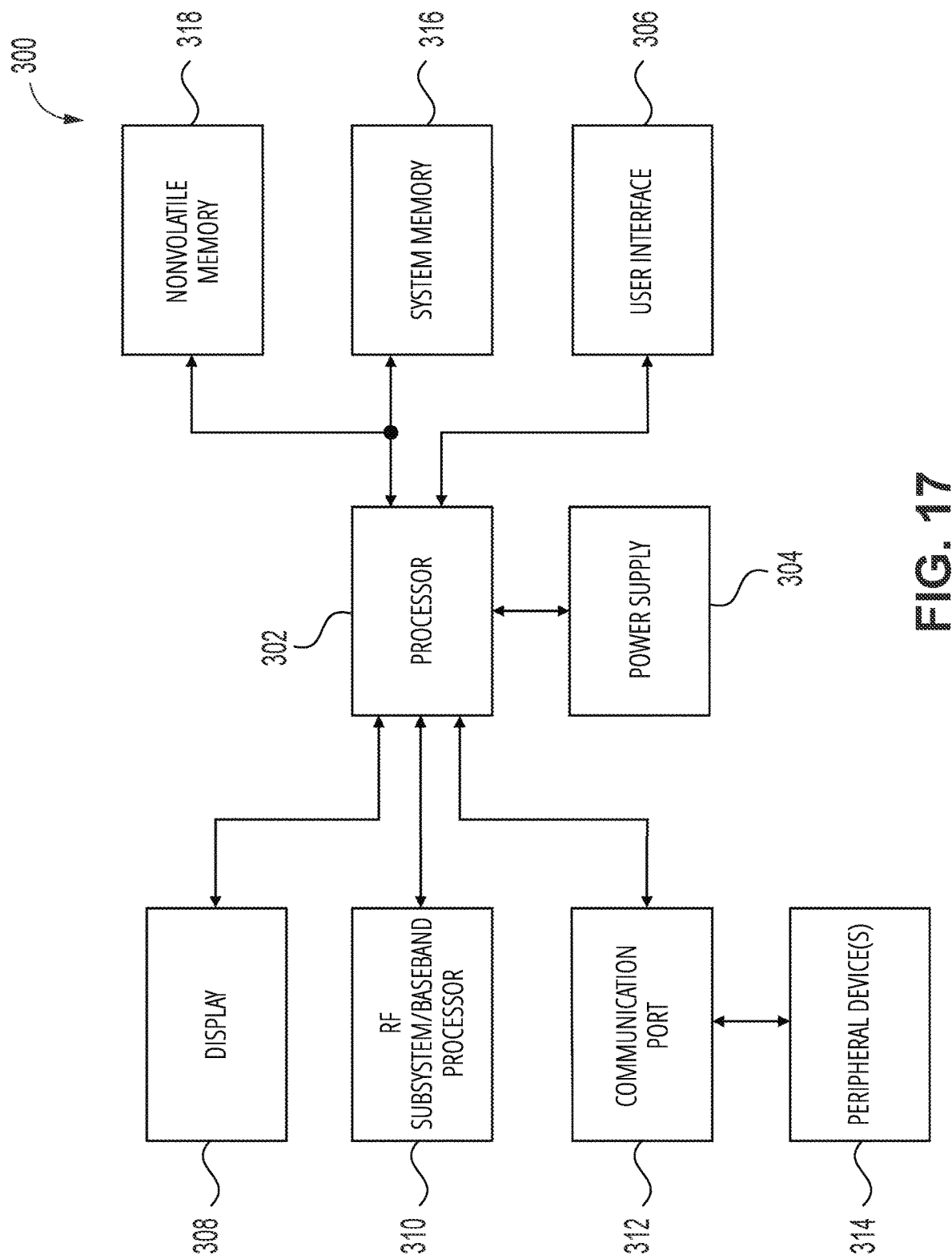
FIG. 17 is a block diagram of a processor-based system, in accordance with embodiments of the disclosure.

With reference to FIG. 17, shown is a block diagram of a processor-based system 300. The processor-based system 300 may include various microelectronic devices (e.g., the microelectronic device 100 of FIG. 15) and microelectronic device structures (e.g., the microelectronic device structure 10 of FIG. 1) manufactured in accordance with embodiments of the present disclosure. The processor-based system 300 may be any of a variety of types, such as a computer, a pager, a cellular phone, a personal organizer, a control circuit, or another electronic device. The processor-based system 300 may include one or more processors 302, such as a microprocessor, to control the processing of system functions and requests in the processor-based system 300. The processor 302 and other subcomponents of the processor-based system 300 may include microelectronic devices (e.g., the microelectronic device 100 of FIG. 15) and microelectronic device structures (e.g., the microelectronic device structure 10 of FIG. 1) manufactured in accordance with embodiments of the present disclosure.

The processor-based system 300 may include a power supply 304 in operable communication with the processor 302. For example, if the processor-based system 300 is a portable system, the power supply 304 may include one or more of a fuel cell, a power scavenging device, permanent batteries, replaceable batteries, and/or rechargeable batteries. The power supply 304 may also include an AC adapter; therefore, the processor-based system 300 may be plugged into a wall outlet, for example. The power supply 304 may also include a DC adapter such that the processor-based system 300 may be plugged into a vehicle cigarette lighter or a vehicle power port, for example.

Various other devices may be coupled to the processor 302 depending on the functions that the processor-based system 300 performs. For example, a user interface 306 may be coupled to the processor 302. The user interface 306 may include one or more input devices, such as buttons, switches, a keyboard, a light pen, a mouse, a digitizer and stylus, a touch screen, a voice recognition system, a microphone, or a combination thereof. A display 308 may also be coupled to the processor 302. The display 308 may include an LCD display, an SED display, a CRT display, a DLP display, a plasma display, an OLED display, an LED display, a three-dimensional projection, an audio display, or a combination thereof. Furthermore, an RF subsystem/baseband processor 310 may also be coupled to the processor 302. The RF subsystem/baseband processor 310 may include an antenna that is coupled to an RF receiver and to an RF transmitter. A communication port 312, or more than one communication port 312, may also be coupled to the processor 302. The communication port 312 may be adapted to be coupled to one or more peripheral devices 314 (e.g., a modem, a printer, a computer, a scanner, a camera) and/or to a network (e.g., a local area network (LAN), a remote area network, an intranet, or the Internet).

The processor 302 may control the processor-based system 300 by implementing software programs stored in the memory (e.g., system memory 316). The software programs may include an operating system, database software, drafting software, word processing software, media editing software, and/or media-playing software, for example. The memory (e.g., the system memory 316) is operably coupled to the processor 302 to store and facilitate execution of various programs. For example, the processor 302 may be coupled to system memory 316, which may include one or more of spin torque transfer magnetic random access memory (STT-MRAM), magnetic random access memory (MRAM), dynamic random access memory (DRAM), static random access memory (SRAM), racetrack memory, and/or other known memory types. The system memory 316 may include volatile memory, nonvolatile memory, or a combination thereof. The system memory 316 is typically large so it can store dynamically loaded applications and data. In some embodiments, the system memory 316 may include semiconductor devices (e.g., the microelectronic device 100 of FIG. 15) and structures (e.g., the microelectronic device structure 10 of FIG. 1) described above, or a combination thereof.

The processor 302 may also be coupled to nonvolatile memory 318, which is not to suggest that system memory 316 is necessarily volatile. The nonvolatile memory 318 may include one or more of STT-MRAM, MRAM, read-only memory (ROM) (e.g., EPROM, resistive read-only memory (RROM)), and Flash memory to be used in conjunction with the system memory 316. The size of the nonvolatile memory 318 is typically selected to be just large enough to store any necessary operating system, application programs, and fixed data. Additionally, the nonvolatile memory 318 may include a high-capacity memory (e.g., disk drive memory, such as a hybrid-drive including resistive memory or other types of nonvolatile solid-state memory, for example). The nonvolatile memory 318 may include microelectronic devices (e.g., the microelectronic device 100 of FIG. 15) and structures (e.g., the microelectronic device structure 10 of FIG. 1) described above.

Accordingly, electronic systems are disclosed. The electronic systems may include an input device, an output device, and a processor device operably coupled to the input device and to the output device. A memory device is operably coupled to the processor device and includes at least one microelectronic device structure. The at least one microelectronic device structure includes a source structure, a stack structure comprising a vertically alternating sequence of insulative structures and conductive structures, and filled slits extending through the stack structure and into the source structure. Memory cell pillars also extend through the stack structure and into the source structure, and bottoms of the memory cell pillars may be substantially coplanar with bottoms of the filled slits.

While the disclosed structures, apparatus (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
   a source structure comprising:
      a source region;
      a cap region vertically overlying the source region; and
      a lateral contact region vertically interposed between the source region and the cap region;
   a stack structure comprising a vertically alternating sequence of insulative structures and conductive structures;
   filled slits extending through the stack structure and into the source structure, the filled slits dividing the stack structure into multiple blocks and each comprising:
      a dielectric liner horizontally adjacent the stack structure and the source structure, portions of the dielectric liner within vertical boundaries of the lateral contact region of the source structure outwardly horizontally offset from additional portions of the dielectric liner within vertical boundaries of the source region and the cap region of the source structure; and
      a fill material surrounded by the dielectric liner; and
   memory cell pillars extending through the stack structure and into the source structure, the memory cell pillars and the filled slits terminating at substantially the same vertical position within the source structure as one another.

2. The microelectronic device of claim 1, wherein each of the memory cell pillars includes an additional dielectric liner horizontally adjacent portions of the source structure.

3. The microelectronic device of claim 2, wherein a lower vertical boundary of the dielectric liner of each of the filled slits is substantially coplanar with a lower vertical boundary of the additional dielectric liner of each of the memory cell pillars.

4. The microelectronic device of claim 1, wherein the fill material of each of the filled slits comprises polysilicon.

5. The microelectronic device of claim 4, wherein the fill material of each of the filled slits is electrically isolated from the source structure by way of the dielectric liner.

6. The microelectronic device of claim 5, wherein the dielectric liner comprises dielectric oxide material.

7. The microelectronic device of claim 1, wherein channel material of each of the memory cell pillars physically contacts doped polysilicon of the lateral contact region of the source structure.

8. The microelectronic device of claim 7, wherein the channel material and a conductive contact region each comprise polysilicon.

9. The microelectronic device of claim 1, further comprising a barrier structure vertically interposed between the source structure and the stack structure, the dielectric liner of each of the filled slits in physical contact with side surfaces and a bottom surface of the barrier structure.

10. The microelectronic device of claim 9, wherein the barrier structure and the dielectric liner of each of the filled slits each comprise at least one dielectric oxide material.

11. The microelectronic device of claim 1, wherein:

the source region of the source structure comprises polysilicon;

the lateral contact region of the source structure comprises N-type doped polysilicon; and the cap region of the source structure comprises additional polysilicon.

12. The microelectronic device of claim 1, further comprising additional dielectric liner at a vertical elevation of the cap region of the source structure and horizontally interposed between semiconductive material of the cap region and the dielectric liner of each of the filled slits.

13. The microelectronic device of claim 12, further comprising a barrier material vertically interposed between the source structure and the stack structure and in physical contact with surfaces of the additional dielectric liner, the semiconductive material of the cap region of the source structure, and the dielectric liner of each of the filled slits.

14. The microelectronic device of claim 1, wherein:

a portion of each of the filled slits within vertical boundaries of the stack structure has a first maximum horizontal width; and an additional portion of each of the filled slits within vertical boundaries of the source structure has a second maximum horizontal width larger than the first maximum horizontal width.

15. The microelectronic device of claim 14, wherein the second maximum horizontal width of the additional portion of each of the filled slits is located within the vertical boundaries of the lateral contact region of the source structure.

16. A memory device, comprising:

a source structure comprising:
  a source region;
  a lateral contact region vertically overlying the source region; and
  a cap region vertically overlying the lateral contact region;

a stack structure comprising an alternating sequence of insulative structures and conductive structures;

filled slits each vertically extending through the stack structure and vertically terminating within the source region of the source structure, the filled slits each comprising:
  a dielectric liner material extending substantially continuously across surfaces of the stack structure and the source structure, portions of the dielectric liner material within vertical boundaries of the lateral contact region of the source structure positioned horizontally outward of additional portions of the dielectric liner material within vertical boundaries of the source region and the cap region of the source structure; and
  a fill material surrounded by the dielectric liner material; and memory cell pillars each vertically extending through the stack structure and vertically terminating at substantially the same location as the filled slits within the source region of the source structure, the memory cell pillars each comprising a channel material, a tunnel dielectric material, a charge blocking material, and an additional dielectric liner material.

17. The memory device of claim 16, wherein, for each of the filled slits, a portion thereof within the vertical boundaries of the source structure horizontally extends outward from an additional portion thereof within vertical boundaries of the stack structure.

18. The memory device of claim 17, wherein, for each of the memory cell pillars, a portion thereof within the vertical boundaries of the source structure horizontally extends outward from an additional portion thereof within the vertical boundaries of the stack structure.

19. An electronic system, comprising:

an input device;

an output device;

a processor device operably coupled to the input device and to the output device; and a memory device operably coupled to the processor device and comprising at least one microelectronic device structure, the at least one microelectronic device structure comprising:
  a source structure comprising a lateral contact region vertically interposed between a source region and a cap region; and
  a stack structure comprising a vertically alternating sequence of insulative structures and conductive structures;
  filled slits extending through the stack structure and into the source structure, the filled slits dividing the stack structure into block portions and individually comprising:
    a dielectric liner material horizontally adjacent the stack structure and the source structure, portions of the dielectric liner material at a vertical elevation of the lateral contact region of the source structure outwardly horizontally offset from additional portions of the dielectric liner material at vertical elevations of the source region and the cap region of the source structure; and
    a fill material surrounded by the dielectric liner material; and
  memory cell pillars extending through the stack structure and into the source structure, bottoms of the memory cell pillars substantially coplanar with bottoms of the filled slits.

20. The electronic system of claim 19, wherein the memory device comprises a 3D NAND memory device.

21. The electronic system of claim 19, wherein the memory device further comprise a control unit comprising CMOS circuitry vertically underlying the stack structure.

* * * * *